(12) United States Patent
Chaney et al.

(10) Patent No.: US 8,071,956 B2
(45) Date of Patent: Dec. 6, 2011

(54) CLEANING OF AN EXTRACTION APERTURE OF AN ION SOURCE

(75) Inventors: Craig R. Chaney, Lanesville, MA (US); Alexander S. Perel, Danvers, MA (US); Leo V. Klos, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 132 days.

(21) Appl. No.: 12/720,933

(22) Filed: Mar. 10, 2010

(65) Prior Publication Data

US 2011/0220812 A1    Sep. 15, 2011

(51) Int. Cl.
*H01J 37/28* (2006.01)

(52) U.S. Cl. ...................................... 250/423 R; 134/15

(58) Field of Classification Search .............. 250/423 R, 250/492.21; 134/2, 9, 15
See application file for complete search history.

(56) References Cited

U.S. PATENT DOCUMENTS 7,791,047 B2 * 9/2010 Horsky et al. ............ 250/492.21
7,820,981 B2 * 10/2010 Horsky et al. ................. 250/425

* cited by examiner

*Primary Examiner* — Kiet Nguyen

(57) ABSTRACT

An ion source includes an arc chamber housing defining an arc chamber having an extraction aperture, and a wiper assembly comprising a wiper positioned outside the arc chamber in a parked position and configured to be driven from the parked position to operational positions to clean the extraction aperture. A wiper assembly for an ion source includes a wiper configured to be positioned outside an arc chamber of the ion source when in a parked position and driven from the parked position to operational positions to clean an extraction aperture of the ion source.

19 Claims, 5 Drawing Sheets

CLEANING OF AN EXTRACTION APERTURE OF AN ION SOURCE

CROSS REFERENCE TO RELATED APPLICATIONS

This application is related to U.S. application Ser. No. 12/720,960 filed Mar. 10, 2010, which is incorporated herein by reference.

FIELD

This disclosure relates generally to ion sources, and more particularly to cleaning of an extraction aperture of an ion source.

BACKGROUND

An ion source is a critical component of an ion implanter. An ion source includes an arc chamber housing defining an arc chamber. The arc chamber housing also has an extraction aperture through which a well defined ion beam is extracted by an extraction electrode assembly positioned proximate the extraction aperture. The ion beam passes through the beam line of the ion implanter and is delivered to a target workpiece such as a semiconductor wafer. The ion source is required to generate a stable, well-defined, uniform ion beam for a variety of different ion species. It is also desirable to operate the ion source in a semiconductor production facility for extended periods of time without the need for maintenance or repair.

In operation, a desired dopant gas is provided to the arc chamber of the ion source. The dopant gas is ionized into a plasma by exposing the dopant gas to energetic electrons. The energetic electrons may be generated in a number of ways. One way to generate electrons is to position a filament proximate a cathode as is done with an indirectly heated cathode (IHC) ion source. The filament is generally sheltered from the plasma in the arc chamber to which the relatively massive cathode is exposed. When heated by the filament, the cathode supplies energetic electrons. A well defined ion beam is extracted through the extraction aperture by a biased extraction electrode assembly positioned proximate the extraction aperture.

Over time, undesirable deposits may form on the extraction aperture. The presence and rate of formation of such deposits may be influenced by the selected dopant gas. For some fluorine containing dopant gases such as boron trifluoride ($BF_3$), germanium tetrafluoride ($GeF_4$), and silicon tetrafluoride ($SiF_4$), undesirable deposits such as tungsten may form on the extraction aperture. For other molecular species, the rate of undesirable deposit formation may be even more severe. For example, for carborane ($C_2B_{10}H_{12}$), undesirable deposits such as carbon and boron may quickly form on the extraction aperture. Such deposits on the extraction aperture can block portions of the ion beam extracted there from.

Such undesirable deposits formed on the extraction aperture may adversely affect beam uniformity, beam current, and ion source lifetime. For example, any beam blockage at the extraction aperture may impact the uniformity of the ion beam extracted there from. These non uniformities may then be transmitted and magnified as the ion beam passes down the beam line to the target workpiece. Such magnification may be exacerbated in ion implanters that provide a "ribbon beam" having an approximately rectangular cross section at a workpiece plane defined by a front surface of the target workpiece. The long dimension of the ribbon beam at the workpiece plane may be at least 10 times greater than the long dimension of the beam extracted from the extraction aperture thus magnifying any blockage issues of the ion beam at the extraction aperture. Beam uniformity problems can contribute to dose uniformity problems at the workpiece plane. Dose uniformity requirements continue to become more stringent as some current specifications require dose uniformity of less than 1% variation at the workpiece plane for ribbon beams. An ion beam with poor beam uniformity due to deposits on the extraction aperture may be improved with tuning techniques that reduce beam current levels. In other words, the beam current of the ion beam extracted from the source would be lowered from desired levels to improve beam uniformity. Lowered beam currents can adversely impact throughput of the associated ion implanter or the number of workpieces processed per time period. Finally, ion source lifetime may be limited by undesirable deposits on the extraction aperture.

Some conventional techniques for removing undesirable deposits in an ion source include introducing particular cleaning gases such as reactive gases into the arc chamber. Although largely effective, such cleaning gas techniques may take 10-60 minutes to complete and, of course, require the cleaning gas and flow control of the same. In addition, the number of molecules in the cleaning gas must be at least as big as the number of atoms to be cleaned. For example, two hours of accumulated deposits might be cleaned in 10 minutes only with a very high flow rate of the cleaning gas. Therefore, the length of time to complete such a cleaning operation adversely impacts throughput.

Accordingly, it would be desirable to provide a technique for cleaning an extraction aperture of an ion source which overcomes the above-described inadequacies and shortcomings.

SUMMARY

According to a first aspect of the disclosure an ion source is provided. The ion source includes an arc chamber housing defining an arc chamber having an extraction aperture, and a wiper assembly. The wiper assembly includes a wiper positioned outside the arc chamber in a parked position and configured to be driven from the parked position to operational positions to clean the extraction aperture.

According to yet another aspect of the disclosure, a wiper assembly for an ion source is provided. The wiper assembly includes a wiper configured to be positioned outside an arc chamber of the ion source when in a parked position and driven from the parked position to operational positions to clean an extraction aperture of the ion source.

The present disclosure will now be described in more detail with reference to exemplary embodiments as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
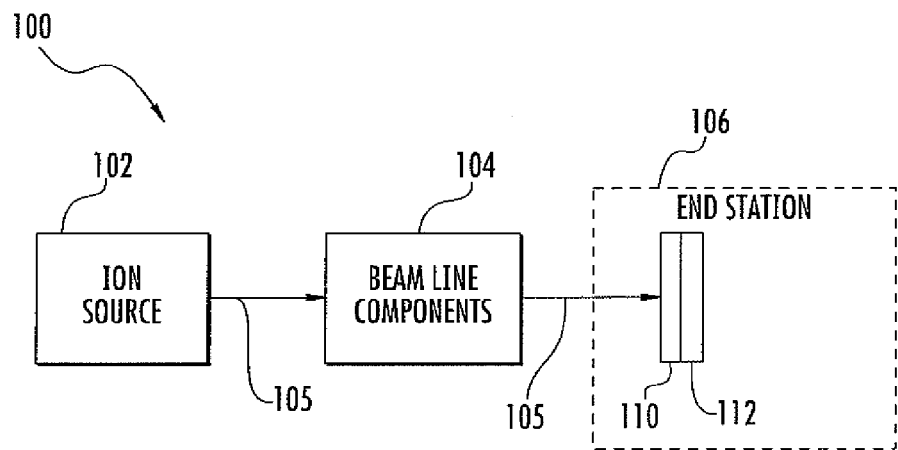
FIG. 1 is a simplified schematic block diagram of an ion implanter.

Turning to FIG. 1, a simplified schematic block diagram of an ion implanter 100 is illustrated. The ion implanter 100 includes an ion source 102 consistent with an embodiment of the disclosure, beam line components 104, and an end station 106 that supports one or more workpieces such as a workpiece 110. The ion source 102 generates an ion beam 105 that is directed via the beam line components 104 to the workpiece 110.

The beam line components 104 may include components known to those skilled in art to control and direct the ion beam 105 towards the workpiece 110. Some examples of such beam line components 104 include, but are not limited to, a mass analyzing magnet, a resolving aperture, ion beam acceleration and/or deceleration columns, an energy filter, and a collimator magnet or parallelizing lens. Those skilled in the art will recognize alternative and/or additional beam line components 104 that may be utilized in the ion implanter 100.

The end station 106 supports one or more workpieces, such as workpiece 110, in the path of ion beam 105 such that ions of the desired species strike the workpiece 110. The workpiece 110 may be, for example, a semiconductor wafer or another object receiving ion treatment. The end station 106 may include a platen 112 to support the workpiece 110. The platen 112 may secure the workpiece 110 using electrostatic forces. The end station 106 may also include a scanner (not illustrated) for moving the workpiece 110 in a desired direction.

The end station 106 may also include additional components known to those skilled in the art. For example, the end station 106 typically includes automated workpiece handling equipment for introducing workpieces into the ion implanter 100 and for removing workpieces after ion treatment. It will be understood to those skilled in the art that the entire path traversed by the ion beam is evacuated during ion treatment. The ion implanter 100 may also have a controller (not illustrated) to control a variety of subsystems and components of the ion implanter 100.

Figure 2:
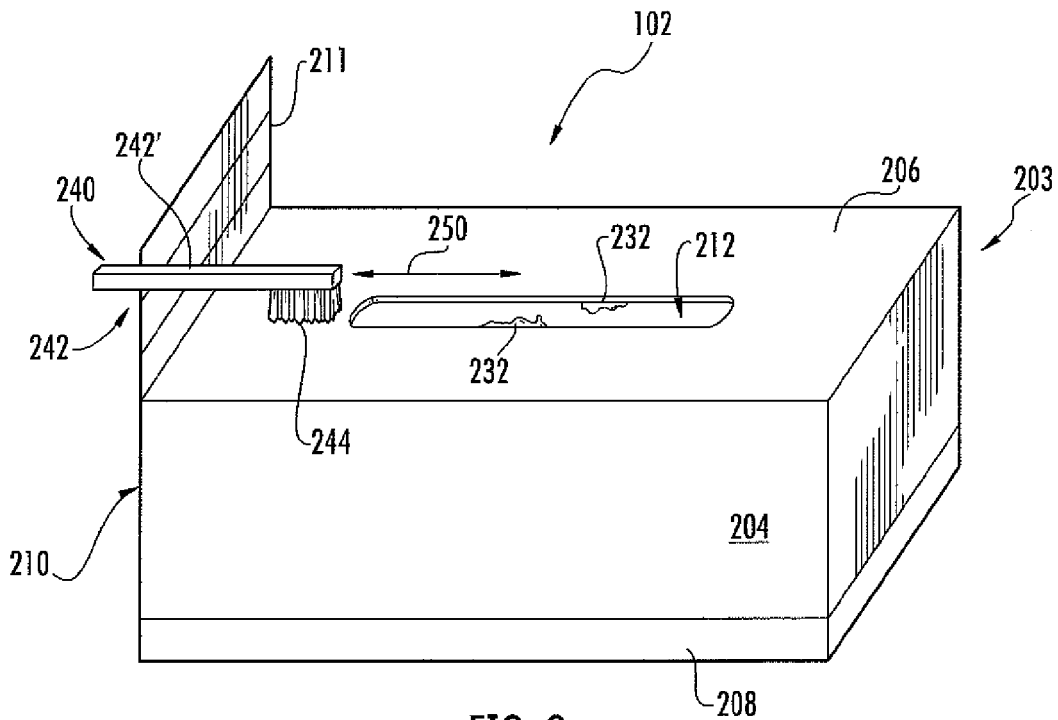
FIG. 2 is a schematic perspective view of an ion source consistent with an embodiment of the disclosure.

Turning to FIG. 2, a schematic perspective view of an ion source 102 consistent with an embodiment of the disclosure is illustrated. For clarity of illustration, some components of the ion source 102 not necessary for an understanding of the disclosure are not illustrated. The ion source includes an arc chamber housing 203 defining an arc chamber 204. The arc chamber housing 203 also defines an extraction aperture 212 through which a well defined ion beam 105 is extracted. The ion beam 105 is extracted from plasma within the arc chamber 204 by an extraction electrode assembly (not illustrated) positioned proximate the extraction aperture 212.

The arc chamber housing 203 may further include a face plate 206 having portions defining the extraction aperture 212, a floor 208 positioned opposite the face plate 206 and four upstanding side walls coupled to the face plate 206 and floor 208 to define the interior arc chamber 204. One of the sidewalls 210 may have a flange 211 that protrudes above the face plate 206. A wiper assembly 240 includes a wiper 242 positioned outside the arc chamber 204 in a parked position 242'. Portions of the flange 211 may support the wiper assembly 240 and position the wiper 242 out of the path of the ion beam 105 when in a parked position. Those skilled in the art will recognize other components that may be used to support the wiper assembly 240. The wiper 242 may include a bar, plate, wire, or brush. In the embodiment of FIG. 2, the wiper includes a plurality of bristles 244. The bristles 244 may be wire bristles fabricated of a refractory metal such as tungsten (W), tantalum (Ta), molybdenum (Mo), rhenium (Re), or carbon (C), and other high temperature materials including ceramics, aluminum oxide ($Al_2O_3$), sapphire, and zirconium.

In operation, a dopant gas from a dopant gas source is provided to the arc chamber 204. The selected dopant gas depends, in part, on the desired dopant element. For instance, the dopant element may include boron (B), germanium (Ge), phosphorous (P), or silicon (Si) and the selected dopant gases may include $BF_3$, $GeF_4$, or $SiF_4$ to name only several. In other instances, a vaporizer may be needed to vaporize a solid dopant material such as carborane ($C_2B_{10}H_{12}$) into a dopant gas to provide to the arc chamber 204.

Over time, undesirable deposits 232 may form on the extraction aperture 212. The undesirable deposits 232 may be tungsten for some fluorine-containing dopant gases, or carbon and/or boron when running $C_2B_{10}H_{12}$. Regardless of the type, the undesirable deposits 232 on the extraction aperture 212 can block portions of the ion beam 105 extracted there from. The wiper 242 can advantageously clean the extraction aperture 212 by removing most, if not all, of any deposits 232. The wiper 242 is configured to extend and retract in a generally linear direction indicated by arrow 250. Therefore, the bristles 244 contact portions of the face plate 206 defining the extraction aperture 212 to clean the same.

Figure 3:
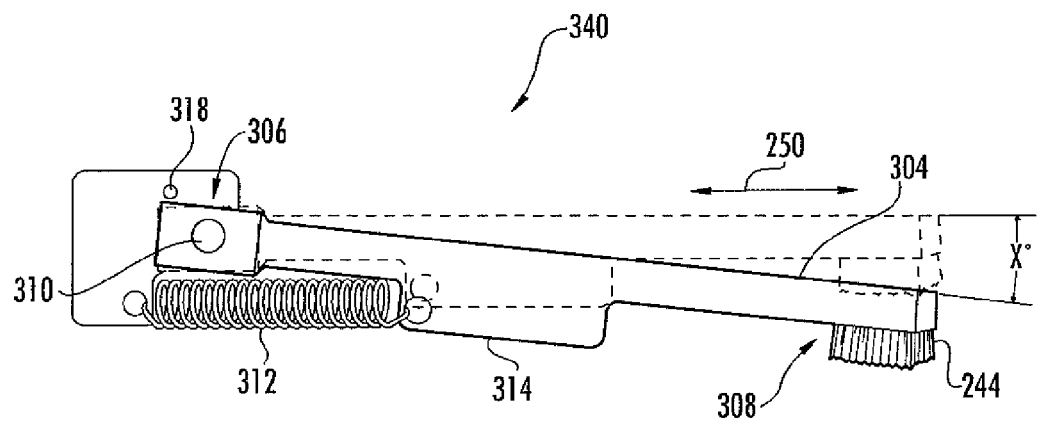
FIG. 3 is a side view of a wiper assembly consistent with the disclosure.

Turning to FIG. 3, a side view of a wiper assembly 340 consistent with one embodiment of the disclosure is illustrated that may be used to clean the extraction aperture 212 of FIG. 2. The wiper assembly 340 includes a retractable arm 304 that can extend from a parked position to operational positions to clean the extraction aperture 212. The retractable arm 304 includes a first end 306 secured to a pivot point 310 and a second unsecured end 308 on the opposing side of the retractable arm 304. A plurality of bristles 244 may also be coupled to the second unsecured end 308. A spring 312 may be coupled to a cam 314 of the retractable arm 304 to provide a biasing force to urge the retractable arm 304 to pivot about the pivot point 310 when not otherwise restricted. A limiting pin 318 may also be positioned to limit the pivoting of the retractable arm 304 about the pivot point 310 to a maximum pivot of x°, which may be about 6° in one embodiment.

In operation, during a cleaning operation the retractable arm 304 is configured to extend and retract in a generally linear direction indicated by arrow 250. The spring 312 provides a biasing force to also pivot the retractable arm 304 about the pivot point 310 as it is extended and retracted. Therefore, the bristles 244 are further urged towards portions of the face plate 206 defining the extraction aperture 212 as they are driven across the extraction aperture. When not in use for cleaning, the retractable arm 304 may be positioned sufficiently away from the extraction aperture 212 in a parked position that does not interfere with the ion beam 5 being extracted from the extraction aperture 212.

Figure 4:
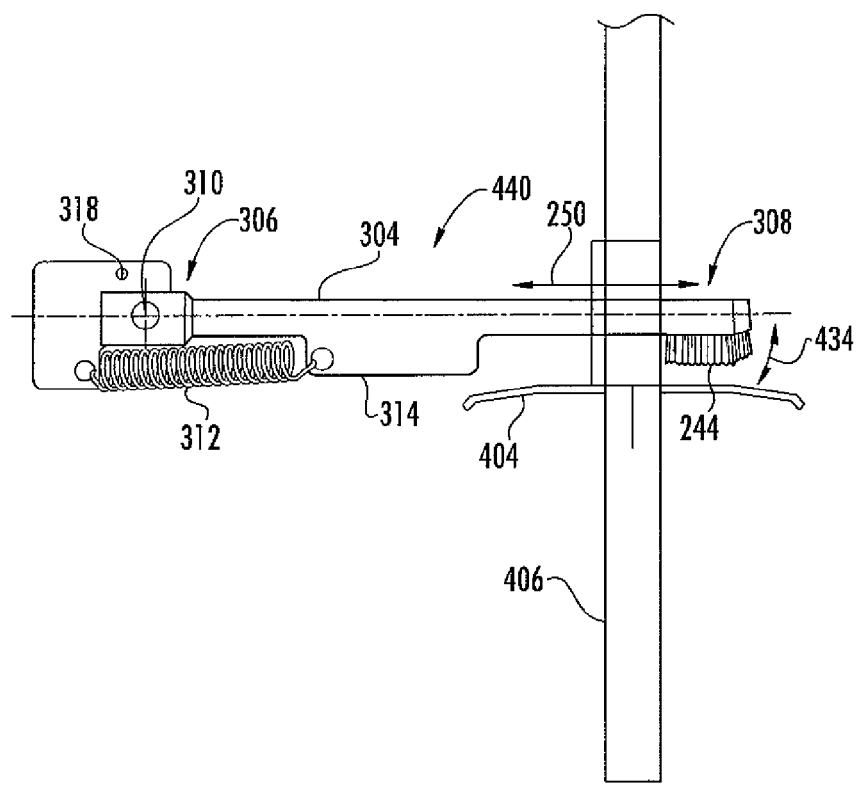
FIG. 4 is a view of the wiper assembly of FIG. 3 including a mounting configuration and guide rail.

FIG. 4 illustrates another embodiment of a wiper assembly 440 consistent with the disclosure. Like parts of FIG. 3 and FIG. 4 are similarly labeled and hence any repetitive description is omitted herein for clarity. Compared to FIG. 3, the wiper assembly 440 also includes a guide rail 404. The guide rail 404 may be shaped similar to an exterior shape of the extraction aperture 212. Furthermore, a source chamber mounting configuration is illustrated in FIG. 4 where the wiper assembly 440 is mounted to a flange 406 positioned proximate the extraction aperture of the ion source to enable cleaning of the same.

In operation, during a cleaning operation the retractable arm 304 is configured to extend and retract in a generally linear direction indicated by arrow 250. The spring 312 provides a biasing force to pivot the retractable arm 304 about the pivot point 310 as the second unsecured portion 308 pivots in the direction indicated by the arrow 434 and the cam 314 contacts the guide rail 404. As the retractable arm 304 is urged to and fro in the direction of arrow 250, the cam 314 follows the contour of the guide rail 404 so that the bristles 244 on the second unsecured end 308 of the retractable arm 304 also generally follow the same contour. With the contour of the guide rail 404 selected to be similar to the contour of the extraction aperture 212, the bristles advantageously move across the extraction aperture 212 following a similar path.

Figure 5:
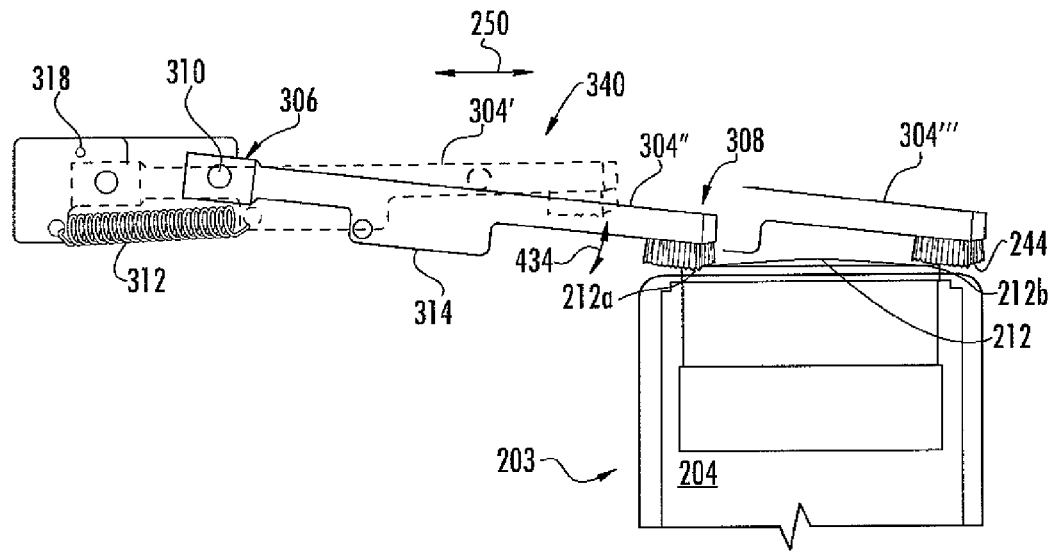
FIG. 5 is a schematic side view of the wiper assembly of FIG. 3 in different positions to clean an extraction aperture of an ion source.

FIG. 5 illustrates the wiper embodiment of FIG. 3 in parked and operational positions relative to the arc chamber housing 203 defining the arc chamber 204 and the extraction aperture 212. Like parts of FIG. 3 and FIG. 5 are similarly labeled and hence any repetitive description is omitted herein for clarity. Initially, the retractable arm 304 may be in a parked position 304' sufficiently away from the extraction aperture 212 so that it does not interfere with an ion beam 5 being extracted therefrom. As a cleaning operation is prompted, the retractable arm 304 extends in a generally linear direction indicated by the arrow 250. In addition, the spring 312 provides a biasing force to pivot the retractable arm 304 about the pivot point 210 as the second unsecured portion 308 pivots in the direction indicated by the arrow 434. The bristles 244 contact a first edge portion 212a of the extraction aperture 212 as illustrated when the retractable arm is in operational position 304". The retractable arm 304 and hence the bristles 244 are generally linearly driven across the entirety of the extraction aperture 212 until they reach a second edge portion 212b on the other end of the extraction aperture 212. Although not illustrated in FIG. 5, a guide rail 404 having a shape similar to an exterior shape of the extraction aperture 212 may also be used to further facilitate guiding of the bristles 214.

Figure 6:
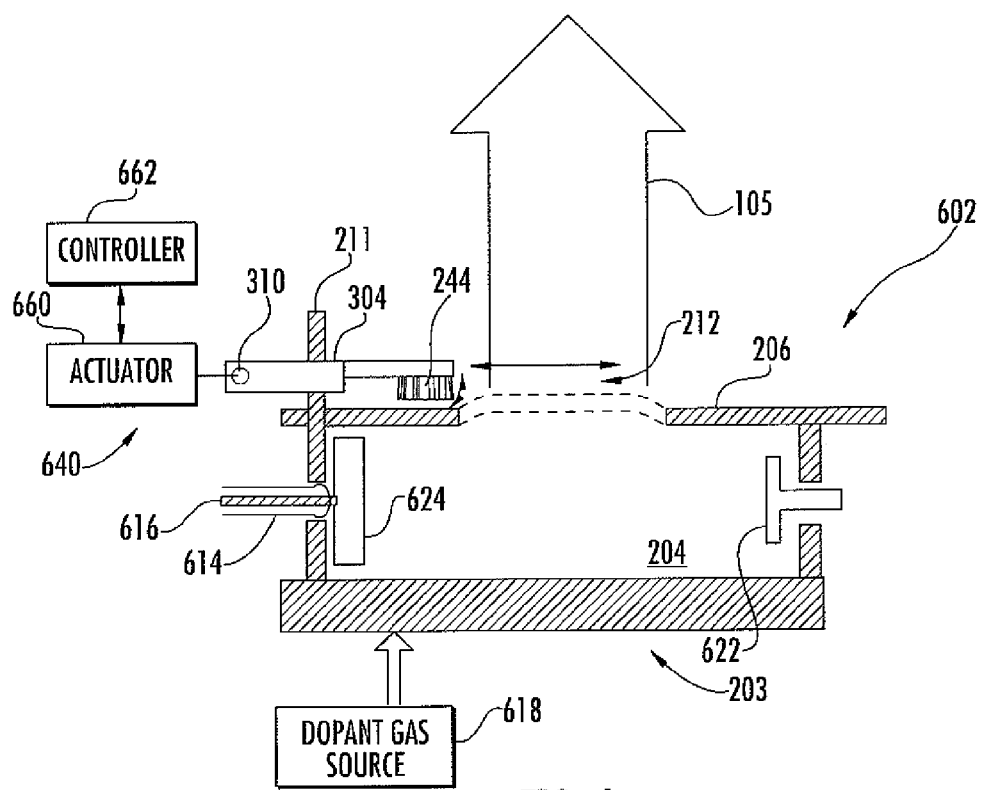
FIG. 6 is a schematic block diagram of an indirectly heated cathode ion source and a wiper assembly consistent with an embodiment of the disclosure.

Turning to FIG. 6, a schematic block diagram of an IHC ion source 602 consistent with another embodiment of the disclosure is illustrated. The IHC ion source 602 includes a cathode 624 and a repeller 622 positioned within the arc chamber 204. The repeller 622 may be electrically isolated. A cathode insulator (not illustrated) may be positioned relative to the cathode 624 to electrically and thermally insulate the cathode 624 from the arc chamber housing 203. A filament 614 may be positioned outside the arc chamber 204 in close proximity to the cathode 624 to heat the cathode 624. A support rod 616 may support the cathode 624 and the filament 614. A dopant gas source 618 provides a dopant gas to arc chamber 204 for ionization.

An extraction electrode assembly is positioned proximate the extraction aperture 212 for extraction of the well-defined ion beam 105. One or more power supplies (not illustrated) may also be provided such as a filament power supply to provide current to the filament 614 for heating thereof and an arc power supply to the bias the arc chamber housing 203.

The IHC ion source 602 also includes a controller 662 and a wiper assembly 640 including an actuator 660 and the retractable arm 304 as detailed in prior embodiments. The controller 662 can be or include a general-purpose computer or network of general-purpose computers that may be programmed to perform desired input/output functions. The controller 662 can also include other electronic circuitry or components, such as application specific integrated circuits, other hardwired or programmable electronic devices, discrete element circuits, etc. The controller 662 may also include communication devices, data storage devices, and software. For clarity of illustration, the controller 662 is illustrated as providing an output signal to the actuator 660 and receiving signals from the same. Those skilled in the art will recognize that the controller 662 may provide output signals to other components of the ion source 602, e.g., associated power supplies, and associated flow control mechanisms for the dopant gas source 618, etc. and receive input signals from the same. The actuator 660 may include a drive mechanism to drive the retractable arm 304 from a parked position to operational positions to clean the extraction aperture 212 with the bristles 244.

In operation, the dopant gas source 618 provides a dopant gas to the arc chamber 204. The filament 614 is heated by an associated power supply to thermionic emission temperatures. Electrons from the filament 614 bombard the cathode 624 to thereby also heat the cathode 624 to thermionic emission temperatures. Electrons emitted by the cathode 424 may be accelerated and ionize gas molecules of the dopant gas to produce a plasma discharge. The electrons within the arc chamber 204 may be caused to follow spiral trajectories by a magnetic field from a magnetic field source to increase the number of ionizing collisions. The repeller electrode 622 builds up a negative charge to repel electrons back through the arc chamber 204 producing additional ionizing collisions. An extraction electrode assembly positioned proximate the extraction aperture 212 extracts ions from the plasma in the arc chamber 204 into a well-defined ion beam 105.

To remove undesirable deposits that may form over time on the extraction aperture 212, the controller 662 may initiate a mechanical cleaning operation. This operation may occur during a recipe change when no plasma is present in the arc chamber 204. Alternatively, the mechanical cleaning operation may occur when there is plasma present in the arc chamber 204. During the mechanical cleaning operation, the actuator 660 drives the arm 304 from a parked position to operational positions as previously detailed so that the bristles 244 contact and clean the extraction aperture 212. This mechanical cleaning operation can take as little as a few seconds.

Figure 7:
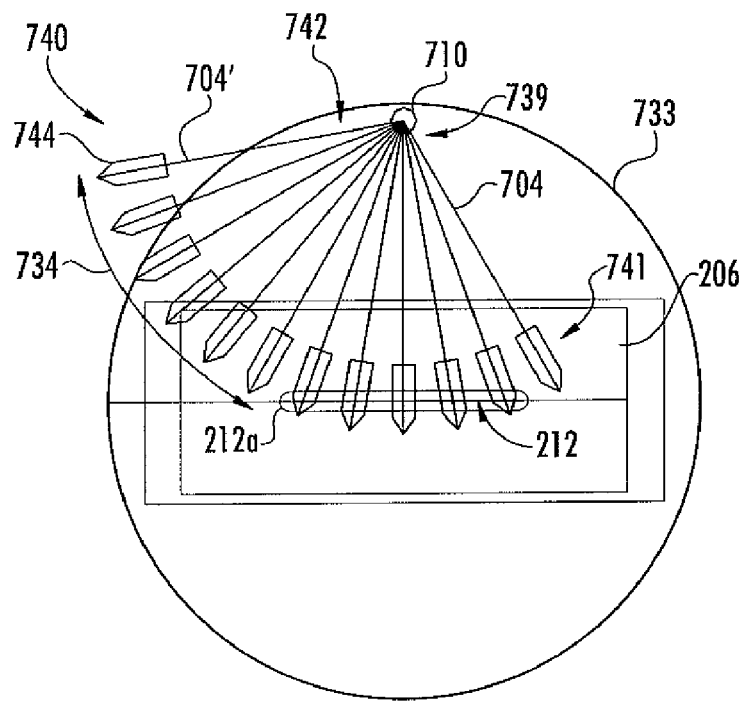
FIG. 7 is a view of another wiper assembly embodiment consistent with the disclosure.

Turning to FIG. 7, a view of another embodiment of a wiper assembly 740 consistent with the disclosure is illustrated relative to the face plate 206 viewed from the perspective of the ion beam coming out of the page from the extraction aperture 212. The wiper assembly 740 includes a wiper 742 positioned outside the arc chamber. The wiper 742 may include an arm 704 having one end 739 secured to a pivot point 710 and a second unsecured end 741 configured to generally follow an arc shaped path 734. The arm 704 may be secured at the pivot point 710 to any surrounding fixed component. In the embodiment of FIG. 7, the arm 704 may be secured to a portion of the ion source housing 733. The ion source housing 733 may be a cylindrical shaped housing having a circular cross section as illustrated in FIG. 7. The ion source may be slid into and out of the ion source housing 733 and the pivot point 710 may be fixed to any position along the interior circumference of the housing 733 or at about a "12 o'clock" position as illustrated in FIG. 7.

FIG. 7 further illustrates the arm 704 in parked and operational positions relative to the extraction aperture 212 of the face plate 206 of an ion source. Initially, the arm 704 may be in a parked position 704' sufficiently away from the extraction aperture 212 so that is does not interfere with the ion beam being extracted there from. As a cleaning operation is prompted, the arm 704 pivots about the pivot point 710 so the unsecured end 741 of the arm generally travels the arced path 734. A plurality of bristles 744 may be coupled to the unsecured end 741 of the arm 704 to brush across the extraction aperture 212 as it is swept across the same. The bristles 744 may be wire bristles fabricated of a refractory metal such as W, Ta, Mo, Re, or C, and other high temperature materials including ceramics, aluminum oxide ($Al_2O_3$), sapphire, and zirconium. One or more sweeps across the extraction aperture 212 may be performed depending on the amount of deposits present and the efficacy of the bristles 744 in removing the same. The wiper 740 may also including a biasing member (not illustrated) such as a spring to bias the bristles 744 towards the extraction aperture or into the page in the view of FIG. 7 to further assist with cleaning of the extraction aperture.

Figure 8:
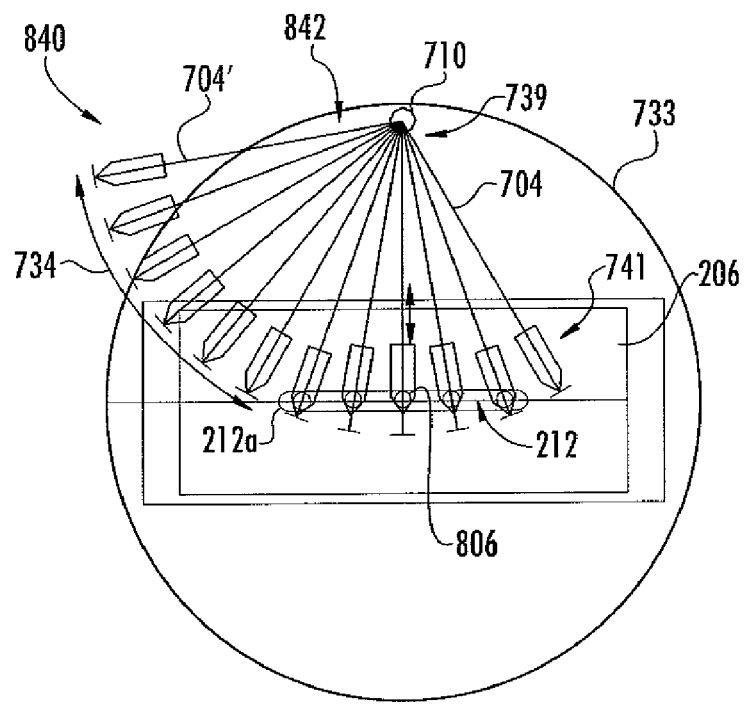
FIG. 8 is a view of yet another wiper assembly embodiment consistent with the disclosure.

Turning to FIG. 8, another embodiment of a wiper assembly 840 including a wiper 842 is illustrated. Like parts of FIGS. 7 and 8 are labeled similarly and hence any repetitive description is omitted herein for clarity. Compared to FIG. 7, the wiper 842 has an arm 704 with a portion 806 on the unsecured end 741 of the arm 704. The portion 806 is configured to linearly travel along the length of the extraction aperture 212 despite the arc shaped path 734 generally followed by the unsecured second end 741 of the arm 704. The portion 806 may include a wire, a pair of wires, or a blunt nosed object sized to fit within the extraction aperture 212. The blunt nosed object may be fabricated of a refractory metal such as W, Ta, Mo, Re, or C, and other high temperature materials including ceramics, aluminum oxide ($Al_2O_3$), sapphire, and zirconium. The wiper 842 may also including a biasing member (not illustrated) such as a spring to bias the portion 806 slightly into the extraction aperture 212 or into the page in the view of FIG. 8 to further assist with cleaning of the extraction aperture 212.

When a cleaning operation is prompted, the arm 704 pivots about the pivot point 710 so the unsecured end 741 of the arm generally travels the arced path 734. The portion 806 of the unsecured end 741 of the arm 704 is configured to engage with the extraction aperture 212 as it reaches a first edge portion 212a of the same. A biasing member may further urge the portion 806 into the extraction aperture 212. The portion 806 is also configured to be slidingly engaged with the arm 704 so that it also slides in both directions about the arm 704 as the unsecured end 741 generally travels the arced path 734. In this way, the portion 806 is configured to also travel in a linear direction along a length of the extraction aperture 212 to clean the same despite the arc shaped path 734 generally followed by the unsecured second end 741 of the arm 704.

Figures 9A, 9B:
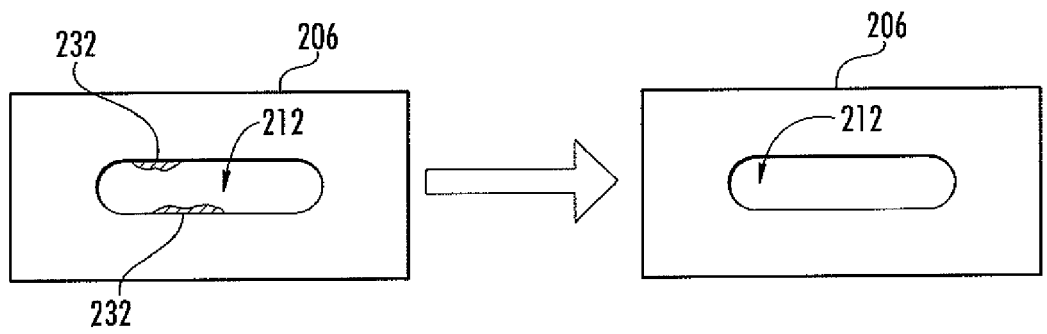
FIGS. 9A and 9B are front views of a face plate and extraction aperture of an ion source before and after cleaning.

FIGS. 9A and 9B illustrate front views of the face plate 206 and extraction aperture 212 before and after a wiper clean operation consistent with the disclosure. FIG. 9A illustrates undesirable deposits 232 formed on edges of the face plate 206 defining the extraction aperture 212. After a mechanical wiper clean operation consistent with the present disclosure, most, if not all, of the undesirable deposits 232 are removed as illustrated in FIG. 9B.

Accordingly, there is provided a wiper positioned outside an arc chamber of an ion source in a parked position, and configured to be driven to other operational positions to clean the extraction aperture of the ion source. This mechanical cleaning process may take as little as a few seconds while other conventional gas cleaning techniques take as long as 10-60 minutes. This reduction in cleaning time improves the overall throughput of an ion implanter utilizing the ion source. In addition, beam uniformity output the extraction aperture is improved resulting in dose uniformity improvement at the workpiece plane. Accordingly, beam current of the ion beam may be maintained at a higher level compared to conventional techniques that lower beam current to address beam uniformity issues caused by deposits blocking portion of the extraction aperture. Furthermore, ion source lifetime may also be improved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source comprising:
   an arc chamber housing defining an arc chamber having an extraction aperture; and
   a wiper assembly comprising a wiper positioned outside the arc chamber in a parked position and configured to be driven from the parked position to operational positions to clean the extraction aperture.

2. The ion source of claim 1, wherein the wiper comprises an arm having a first end secured to a pivot point and a second unsecured end configured to pivot about the pivot point when driven to the operational positions to clean the extraction aperture.

3. The ion source of claim 1, wherein the wiper comprises a retractable arm configured to be extended to the operational positions to clean the extraction aperture and retracted to the parked position, the retractable arm having a first end secured to a pivot point and a second unsecured end configured to pivot about the pivot point as the retractable arm is extended to the operational positions.

4. The ion source of claim 3, further comprising a plurality of bristles coupled to the second unsecured end of the retractable arm to brush the extraction aperture as the retractable arm is extended to the operational positions.

5. The ion source of claim 4, wherein the wiper assembly further comprises a guide rail and the retractable arm has a cam configured to contact the guide rail as the retractable arm is extended to the operational positions, the guide rail having a shape similar to an exterior shape of the extraction aperture to guide the plurality of bristles across the extraction aperture.

6. The ion source of claim 3, wherein the wiper assembly further comprises a spring configured to bias the retractable arm towards the extraction aperture by pivoting the retractable arm about the pivot point.

7. The ion source of claim 3, wherein the wiper assembly further comprises a limiting pin disposed proximate the pivot point to limit a maximum rotation of the retractable arm when the retractable arm contacts the limiting pin.

8. The ion source of claim 1, wherein the wiper comprises an arm having a first end secured to a pivot point and a second unsecured end configured to travel an arced shaped path when driven to the operational positions to clean the extraction aperture.

9. The ion source of claim 8, wherein the second unsecured end of the arm has a portion slidingly coupled to the arm, the portion configured to engage the extraction aperture when driven to the operational positions and the portion configured to move linearly along a long dimension of the extraction aperture as it also slides along the arm.

10. A wiper assembly for an ion source, comprising:
a wiper configured to be positioned outside an arc chamber of the ion source when in a parked position and driven from the parked position to operational positions to clean an extraction aperture of the ion source.

11. The wiper assembly of claim 10, wherein the wiper comprises an arm having a first end secured to a pivot point and a second unsecured end configured to pivot about the pivot point when driven to the operational positions to clean the extraction aperture.

12. The wiper assembly of claim 10, wherein the wiper comprises a retractable arm configured to be extended to the operational positions to clean the extraction aperture and retracted to the parked position, the retractable arm having a first end secured to a pivot point and a second unsecured end configured to pivot about the pivot point as the retractable arm is extended to the operational positions.

13. The wiper assembly of claim 12, further comprising a plurality of bristles coupled to the second unsecured end of the retractable arm to brush the extraction aperture as the retractable arm is extended to the operational positions.

14. The wiper assembly of claim 13, further comprising a guide rail and wherein the retractable arm has a cam configured to contact the guide rail as the retractable arm is extended to the operational positions, the guide rail having a shape similar to an exterior shape of the extraction aperture to guide the plurality of bristles across the extraction aperture.

15. The wiper assembly of claim 13, wherein the plurality of bristles comprise at least one of tungsten, molybdenum, tantalum, rhenium, and carbon.

16. The wiper assembly of claim 12, further comprising a spring configured to bias the retractable arm towards the extraction aperture by pivoting the retractable arm about the pivot point.

17. The wiper assembly of claim 12, further comprising a limiting pin disposed proximate the pivot point to limit a maximum rotation of the retractable arm when the retractable arm contacts the limiting pin.

18. The wiper assembly of claim 10, wherein the wiper comprises an arm having a first end secured to a pivot point and a second unsecured end configured to travel an arced shaped path when driven to the operational positions to clean the extraction aperture.

19. The wiper assembly of claim 18, wherein the second unsecured end of the arm has a portion slidingly coupled to the arm, the portion configured to engage the extraction aperture when driven to the operational positions and the portion configured to move linearly along a long dimension of the extraction aperture as it also slides along the arm.

\* \* \* \* \*